United States Patent [19]

Hause et al.

[11] Patent Number: 4,579,760
[45] Date of Patent: Apr. 1, 1986

[54] WAFER SHAPE AND METHOD OF MAKING SAME

[75] Inventors: James R. Hause, Tucson, Ariz.; Eric Mendel, Poughkeepsie, N.Y.

[73] Assignee: International Business Machines Corporation, Armonk, N.Y.

[21] Appl. No.: 689,732

[22] Filed: Jan. 8, 1985

[51] Int. Cl.⁴ .............................................. B32B 3/02
[52] U.S. Cl. ................................... 428/66; 428/542.8; 428/213
[58] Field of Search ..................... 428/81, 64, 66, 192, 428/542.8, 157, 156, 213

[56] References Cited

FOREIGN PATENT DOCUMENTS 70753  6/1977  Japan ..................................... 428/66

Primary Examiner—Alexander S. Thomas
Attorney, Agent, or Firm—Robert E. Sandt

[57] ABSTRACT

A semiconductor wafer shape which when subjected to a simultaneous polishing of both wafer surfaces produces a wafer of superior flatness and surface finish, the said wafer having a diametral cross-sectional shape like that of a "dogbone" wherein the wafer is thinner in its medial region than it is in the peripheral region and has rounded edges, this shape resulting from a chemical thinning operation.

7 Claims, 2 Drawing Figures

WAFER SHAPE AND METHOD OF MAKING SAME

DESCRIPTION

1. Technical Field

This invention relates generally to the art of semiconductor device fabrication, and more particularly to an improved semiconductor wafer shape and the method of making said improved shape of wafer.

2. Background Information

In the manufacture of very large scale integrated circuit devices a very large monocrystalline boule is grown with the desired orientation of the crystal axes. This boule is then ground to a cylindrical shape with added flats, or other fiduciary marks. The boule is then sliced into very thin individual wafers. Depending on the surface finish left by the slicing saw, the wafers may, if necessary be ground or lapped to remove the saw marks and to improve the parallelism of the wafer surfaces.

The next step is to chemically thin the wafers to further refine the surface finish and to remove any stresses induced by the slicing and/or grinding or lapping operation.

Finally, the wafers are polished to the desired thickness to provide highly polished parallel planar surfaces to the wafer.

The wafers are then processed to produce a plurality of individual very large integrated circuit chips. As the size of the wafers increases and derivatively the number of chips per wafer, the planarity (or lack thereof) becomes extremely critical. Also, as the number of devices per chip increases, the size of any discrete region of a device and the interconnecting metallizations becomes smaller, even microscopic.

Not only is it critical that there be no crystallographic flaws in the wafer which would have a deleterious effect upon device performance, but equally critical is the necessity to have a "perfect" planar surface throughout the surface of the wafer. This is necessary because the subsequent device process steps employ photolithographic steps. Any non-planarity of the wafer surface will give rise to distortions which will affect the tolerances of the semiconductor devices and in the limit will render them inoperative.

Intuitively one would believe that to obtain a "perfect" wafer, i.e. one with two perfectly parallel flat mirrored surfaces, one should attempt at each step, beginning with the slicing of wafers from the boule to maintain the surfaces as parallel planar as possible at each successive step, so that the next following step need only provide minor corrections to the non-parallelism, non-planarity, surface roughness and surface stresses until the required precision is attained.

It is also to be noted that it is standard practice in the preparation of wafers for semiconductor device fabrication to chamfer, round or otherwise break the square corners at the edges of the wafer.

Contrary to one's intuitive beliefs, and the practice in the industry, it has been discovered that if one adjusts the parameters of the chemical thinning step in the processing of a wafer so as to achieve a diametrical cross-section having the shape of a "dogbone", i.e. thinner in the medial region than in the peripheral region, with a rounded edge, a wafer having substantially flatter parallel surfaces will result when the wafer is subsequently polished in a simultaneous two-surface polishing apparatus such as that shown in U.S. Pat. No. 3,619,694.

SUMMARY OF THE INVENTION

It is therefore an object of this invention to provide an improvement in the processing of semiconductor wafers to produce wafers having a superior flatness.

A further and specific object is to provide an improvement in the chemical thinning process step in the succession of steps for the preparation of wafers for the subsequent fabrication of semiconductor devices.

A final object is to produce a semiconductor wafer wherein the wafer is thinner in its medial region than it is in the peripherial region of the wafer.

DETAILED DESCRIPTION

Figure 1:
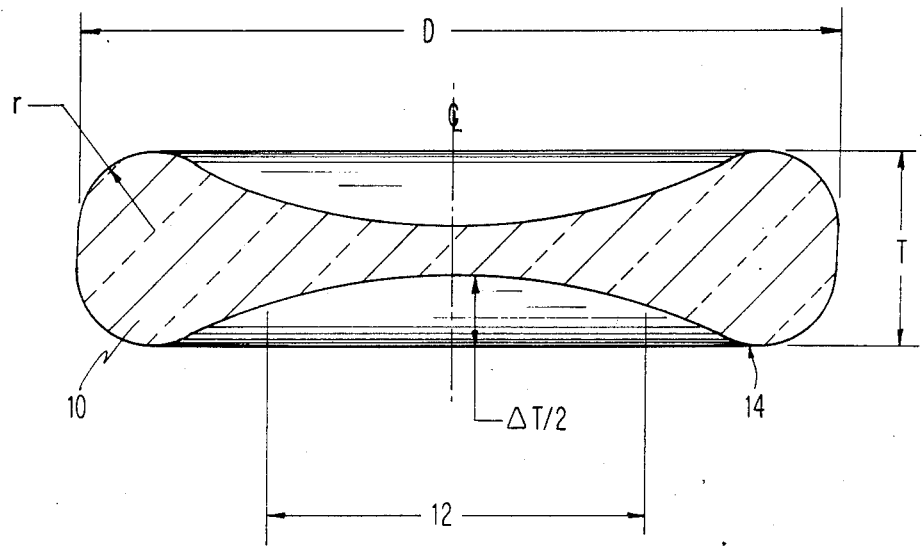
FIG. 1 is an exaggerated diametrical cross-section of a wafer illustrating the "dogbone" shape.

The improved wafer shape is shown in FIG. 1. This is a diametrical cross-section of a generally disc-shaped semiconductor wafer, with the section being taken along a diameter which does not intersect a fiducial mark.

As can readily be seen from the drawing the wafer 10 has a generally "dogbone" shape wherein the thickness in the medial region 12 is less than it is in the peripheral region 14. The corners of the wafer are non-rectilinear having a radius R.

It is appreciated that the drawing is not to scale, because the difference in thickness and the corner radii are very small as compared with the gross dimensions of the wafer. To appreciate the magnitude of the difference in thicknesses and of the radius the following is a table of value of a preferred embodiment of each of several different sizes of wafers:

|   | D | T | ΔT | R |
|---|---|---|----|---|
| 1 | 82.5 mm | 445 μm | 5 μm | 0.05 mm |
| 2 | 100 mm | 665 μm | 5 μm | 0.05 mm |
| 3 | 125 mm | 665 μm | 5 μm | 0.05 mm |
| 4 | 200 mm | 800 μm | 5 μm | 0.05 mm |

The foregoing tabular values are the preferred dimensions within a range of dimensions which will produce a superior wafer after polishing. The surface flatness and finish resulting from the polishing operation will be hereinafter described.

It should be noted that the shape shown exaggerated in FIG. 1, and typically dimensioned in the table is the inherent result of our chemical thinning operation. Thus, because of the dynamic flow of the etchant solution with respect to the wafers, the concentration and temperature of the etchant, and the duration of the chemical thinning operation, the resultant smooth transitional curve from minimal thickness at the wafer center to a maximum thickness at the wafer edges will be automatically achieved. The important parameter is the difference in the medial and peripheral thicknesses thickness.

It has been determined through experimentation that the difference (ΔT) between the maximum and minimum can be expressed by the formula.

$$\Delta T = aD$$

wherein
ΔT=the difference in thicknesses
D=the outside diameter of the wafer
a=a dimensionless ratio If the diameter D is expressed in millimeters and ΔT is expressed in the same dimensions then "a" should be chosen from the range of $5 \times 10^{-6}$ to $1 \times 10^{-4}$. A value of "a" less than the foregoing range will not produce a wafer of acceptable flatness, and a value of "a" greater than the higher range value will require a longer polishing time to achieve an equivalent surface flatness.

For each of several wafer sizes the preferred value of "a" is as follows:

| Wafer D (mm) | Preferred "a" |
| --- | --- |
| 82.5 | $6.1 \times 10^{-5}$ |
| 100 | $5 \times 10^{-5}$ |
| 125 | $4 \times 10^{-5}$ |
| 200 | $2.5 \times 10^{-5}$ |

It has been repeatedly demonstrated, and documented in the prior art, that square corners on a wafer are undesirable. Square corners tend to fracture unpredictably and the fractures may encroach on the area intended for device fabrication. Therefore, the square corners were intentionally rounded either mechanically or by selective chemical etching. A derivative benefit of the chemical thinning operation to be described is that the square corners are rounded, but not to such an extent that the rounded arc extends into the area intended for device fabrication after the wafer is polished.

Figure 2:
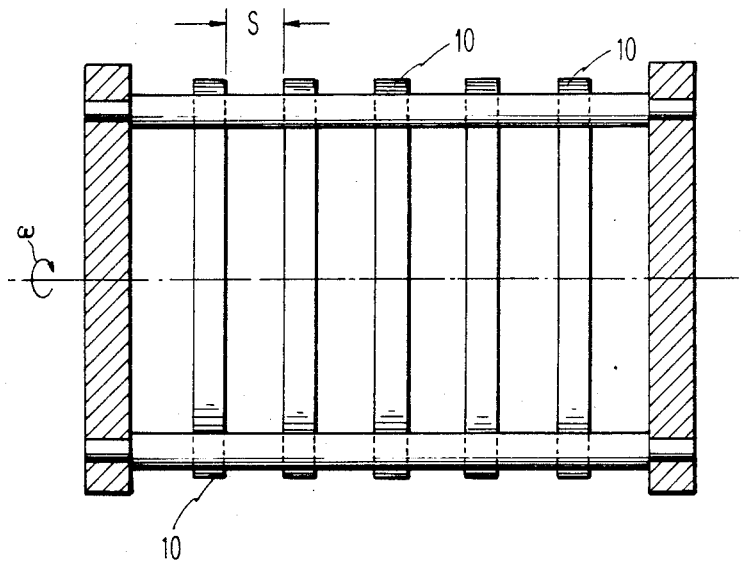
FIG. 2 is a schematic representation of the mounting cage for the nested wafers.

Referring now to FIG. 2 which illustrates schematically a chemical thinning apparatus. The wafers 10 are nested by edge supports in a fixture 20, which is rotated at selectable speeds about an axis A—A. The fixture 20 with the mounted wafers is totally immersed in an etchant solution contained in an enclosed trough (not shown). Since the wafer profile is a function of the etch rate of the selected semiconductor material, the dynamic flow of the etchant solution over the wafer surface, and the time the wafers are exposed to the etchant, it is desirable to standardize the variable for any given wafer material and size so the process can be replicated with a high degree of precision.

The etch rate is a function of the material to be etched, the composition of the etchant and temperature. Therefore, the simplest way to define this variable is to define the range of etch rates which will produce the "dogbone" shape when a nest of wafers is revolved in the solution at a selected speed and time. This then provides a choice of etchants and temperatures.

It has been found that an etch rate from 0.10 to 0.53 microns per second, as measured by a sample immersed in a stagnant bath of etchant, is the preferred range. Thus, one can vary the temperature of a given etchant to increase the etch rate or maintain the temperature constant and vary the composition of the etchant to achieve the desired etch rate within the range.

It has also been found to be desirable to constantly replenish the etchant in the thinning apparatus and to maintain its temperature within a small range.

For doped silicon wafers suitable for semiconductor fabrication, the preferred etch rate is 0.34 microns per second with the bath at a temperature of 55° C. The etchants that have been employed successfully are as follows, with formula 1 being preferred:

| | Nitric Acid $HNO_3$ | Acetic Acid $CH_3COOH$ | Hydrofluoric Acid HF |
| --- | --- | --- | --- |
| 1 | 3 | 2 | 1 |
| 2 | 8 | 3 | 1 |

As has been stated the resulting wafer shape is also a function of the dynamic flow of the etchant over the wafer surface. Intuitively one can appreciate that the flow of the etchant with respect to the wafer surface is a hydrodynamic phenomenon which is probably susceptible to analysis by application of the principles of fluid dynamics. However, rather than attempt this complex analysis and solution, it is preferable to recognize a few fundamental principles and develop a range of process parameters by experimentation that produce the desired results and replicate these parameters for each successive batch of wafers.

The first parameter for consideration is the spacing between adjacent wafers. In the limit of zero spacing the etchant will be inhibited from penetrating to the medial region of the wafers. This is obviously an inoperative choice if the wafers are to be chemically thinned more in the medial region than at the peripheral region. The opposite limit of "infinite" spacing between wafers is equally impractical because it would limit the number of wafers that could be batch processed. Therefore, for maximum production efficiency it is desirable to select an inter wafer spacing as small as possible which will produce the requisite "dogbone" shape.

It has been found, again by experimentation, that the preferred spacing (S) between wafers lies within the range of values defined by the formula $$S = bD$$

where
S=spacing between facing surfaces of adjacent wafers
D=wafer outside diameter
b=a constant within the range from 0.05 to 0.20.

It will be noted that the wafer thickness does not appear in the foregoing relationship, because "S" is the distance between adjacent surfaces, not the center-to-center distance. The perturbation of the etchant is primarily affected by the spacing between the surfaces and very little if any by the wafer thickness, at least for the range of semiconductor wafers useful for fabricating semiconductor devices.

The final variable is the speed of rotation of the encaged stack of wafers. The rotational speed cannot be expressed as a function of wafer diameter, inter-wafer spacing, etch rate and/or etch time. However, it has been found through experimentation that the speed range and optimum speed are as follows:

| Wafer Diam. | R.P.M. Range | Optimum RPM |
| --- | --- | --- |
| 82.5 m.m | 65–110 | 90 |
| 100 m.m | 60–90 | 80 |
| 125 m.m | 50–80 | 68 |

It has been demonstrated, again through experimentation, that the optimum process parameters for a variety of different wafer sizes are as follows:

| Wafer Diam. | Wafer Thickness | Spacing Spacing | Rate Rate | R.P.M. R.P.M. | Time Time |
| --- | --- | --- | --- | --- | --- |
| 1-2.5 mm | 422 μm | 3 mm | 0.35 μm/sec | 90 | 120 sec |
| 2-100 mm | 430 μm | 3 mm | 0.33 μm/sec | 80 | 150 sec |
| 3-100 mm | 660 μm | 5 mm | 0.33 μm/sec | 80 | 150 sec |
| 4-125 mm | 668 μm | 7 mm | 0.32 μm/sec | 68 | 180 sec |

The finished dimensions of the foregoing wafers after simultaneous double surface polishing in a machine such as that described in U.S. Pat. No. 3,691,694 are as follows (with reference to FIG. 1)

| Wafer | D | T | ΔT |
| --- | --- | --- | --- |
| 1 | 82.5 mm | 380 μm | 0 |
| 2 | 100 mm | 380 μm | 0 |
| 3 | 100 mm | 610 μm | 0 |
| 4 | 125 mm | 610 μm | 0 |

Illustrative of the success of this process for producing flat wafers, the following table represents measured values of flatness and surface finish for wafers polished from a "dogbone" wafer blank.

| Wafer | D | T | Flatness, μm (3 mm edge exclusion zone) |
| --- | --- | --- | --- |
| 1 | 82.5 mm | 380 μm | ≦3 μm |
| 2 | 100 mm | 380 μm | ≦3 μm |
| 3 | 100 mm | 610 μm | ≦3 μm |
| 4 | 125 mm | 610 μm | ≦3 μm |

As illustrative of typical wafer processing from slicing through final polishing, the following dimensions are typical for two widely used thicknesses of 80 mm (3 inch nominal) wafers and 125 mm (5 inch nominal) wafers.

| | Thickness | Thickness |
| --- | --- | --- |
| Slice | 0.0220 | 0.0315 |
|  | 559 | 800 |
| Lap/Grind | 0.0192 | 28.5 |
|  | 487 | 724 |
| Etch | 0.0175 | 0.262 |
|  | 445 | 665 |
| Final Polish | 0.0160 | 0.0246 |
|  | 406 | 625 |

(dimensions are in inches and micrometers at end of process step.)

While the process parameters for a preferred process have been set forth, it is apparent that combinations of other parameters may also produce a "dogbone" wafer shape. However, the preferred values have been demonstrated to produce consistent results in a production environment where production time, and derivatively cost is a prime consideration in the selection of parameters.

We claim:

1. An improved semiconductor wafer shape, which when subjected to a subsequent polishing operation, in which both surfaces are simultaneously free-polished, produces a finished wafer having improved surface flatness and parallelism for the fabrication of very large scale integrated circuit devices, characterized by;

The said wafer has a diametral cross-sectional shape wherein (a) The thickness of the wafer varies smoothly from a thin portion in the medial region of the wafer to a thicker portion at the peripheral region of the wafer, and;

(b) The edges of the wafer are rounded whereby the cross-section can be visualized as having a "dogbone" like shape.

2. The wafer shape as claimed in claim 1 wherein;

The difference in thickness (ΔT) between the thinner medial region and the thicker peripheral region satisfies the following relationship:

$$\Delta T = aD$$

wherein

ΔT = the difference between the respective thicknesses

D = the diameter of the wafer a = a dimensionless constant within the range from $5 \times 10^{-6}$ to $1 \times 10^{-4}$.

3. The wafer shape as claimed in claims 1 or 2 wherein;

the edges of the wafer are rounded with a radius of curvature (R) satisfying the following relationship:

$$R = b(T)$$

wherein

R = radius of curvature of the rounded edge

T = thickness of the wafer b = a dimensionless constant within the range of 0.01 to 0.15.

4. The wafer shape as claimed in claim 1 wherein the shape is produced by a chemical thinning operation.

5. The wafer shape as claimed in claim 4 wherein the chemical thinning comprises the steps of:

(a) Including the wafer coaxially among a nest of spaced apart wafers wherein the spacing (S) between the wafers has a dimension equal to $$S = bD$$

wherein

S = the linear distance separating adjacent wafers

D = diameter of the wafers b = dimensionless constant within the range of 0.016 to 0.200.

(b) Immersing the thus-nested wafers in an etching solution having an etch rate for the semiconductor material in the range from 0.10 to 0.53 microns per second.

(c) and rotating the thus-immersed wafers at a speed of from 50 RPM to 110 RPM for a time between 2 and 5 minutes.

6. The wafer shape as claimed in claim 5 wherein the preferred spacing between wafers having a nominal diameter of 3 inches is 3 mm.

7. The wafer shape as claimed in claim 5 wherein the preferred spacing between wafers having a nominal diameter of 5 inches is 7 mm.

* * * * *

UNITED STATES PATENT AND TRADEMARK OFFICE
CERTIFICATE OF CORRECTION

PATENT NO. : 4,579,760
DATED : April 1, 1986
INVENTOR(S) : J. R. Hause et al

It is certified that error appears in the above-identified patent and that said Letters Patent is hereby corrected as shown below:

Column 4, line 35, delete "(5)" and insert --(S)--.

Column 5, line 3, delete "Rate" and insert --Etch--.

Column 5, line 3, delete "R.P.M." and insert --$\omega$--.

Column 5, line 6, delete "1-2.5mm" and insert --1-82.5mm--.

Signed and Sealed this

Twenty-third Day of September 1986

[SEAL]

Attest:

DONALD J. QUIGG

Attesting Officer

Commissioner of Patents and Trademarks